(12) United States Patent
Strenz et al.

(10) Patent No.: US 7,968,934 B2
(45) Date of Patent: Jun. 28, 2011

(54) MEMORY DEVICE INCLUDING A GATE CONTROL LAYER

(75) Inventors: Robert Strenz, Dresden (DE); Christian Peters, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/776,197

(22) Filed: Jul. 11, 2007

(65) Prior Publication Data

US 2009/0014776 A1 Jan. 15, 2009

(51) Int. Cl.
*H01L 29/788* (2006.01)
*H01L 29/76* (2006.01)

(52) U.S. Cl. ........ 257/319; 257/316; 257/318; 257/320; 257/321; 257/322; 257/E21.422; 257/E29.3

(58) Field of Classification Search .................. 257/316, 257/318–322, E21.422, E29.3
See application file for complete search history.

(56) References Cited

U.S. PATENT DOCUMENTS

| | | | | |
|---|---|---|---|---|
| 5,053,841 A * | 10/1991 | Miyakawa et al. | ........... 257/318 |
| 5,065,201 A * | 11/1991 | Yamauchi | ................ 365/185.08 |
| 5,394,360 A * | 2/1995 | Fukumoto | ................ 365/185.15 |
| 5,668,757 A * | 9/1997 | Jeng | ............................ 365/185.1 |
| 5,691,939 A | 11/1997 | Chang et al. | |
| 5,710,735 A * | 1/1998 | Shin et al. | ................ 365/185.26 |
| 5,953,611 A | 9/1999 | Tanaka | |
| 5,973,357 A * | 10/1999 | Uenoyama et al. | ........... 257/321 |
| 5,986,941 A | 11/1999 | Pang et al. | |
| 5,991,204 A * | 11/1999 | Chang | ...................... 365/185.29 |
| 6,005,807 A * | 12/1999 | Chen | ........................ 365/185.26 |
| 6,040,216 A * | 3/2000 | Sung | .............................. 438/257 |
| 6,057,575 A * | 5/2000 | Jenq | .............................. 257/319 |
| 6,104,057 A * | 8/2000 | Nakanishi et al. | ............. 257/314 |
| 6,200,865 B1 * | 3/2001 | Gardner et al. | ............... 438/291 |
| 6,211,548 B1 * | 4/2001 | Ma | ................................. 257/321 |
| 6,326,661 B1 * | 12/2001 | Dormans et al. | .............. 257/315 |
| 6,476,440 B1 * | 11/2002 | Shin | .............................. 257/320 |
| 6,486,509 B1 * | 11/2002 | Van Houdt | .................... 257/319 |
| 6,493,262 B1 | 12/2002 | Wald et al. | |
| 6,518,619 B2 * | 2/2003 | Verhaar et al. | ................ 257/316 |
| 6,621,115 B2 * | 9/2003 | Jenq et al. | ..................... 257/314 |
| 6,635,533 B1 * | 10/2003 | Chang et al. | .................. 438/259 |
| 6,703,662 B1 * | 3/2004 | Koishikawa | .................. 257/316 |
| 6,764,905 B2 * | 7/2004 | Jeng et al. | ..................... 438/267 |
| 6,844,590 B2 * | 1/2005 | Goda et al. | .................... 257/326 |
| 6,875,660 B2 * | 4/2005 | Hung et al. | .................... 438/279 |
| 6,894,339 B2 * | 5/2005 | Fan et al. | ...................... 257/314 |
| 6,897,521 B2 * | 5/2005 | Wu et al. | ....................... 257/320 |
| 7,009,242 B2 * | 3/2006 | Nagai | ............................. 257/315 |
| 7,009,244 B2 * | 3/2006 | Jenq et al. | ..................... 257/316 |
| 7,087,955 B2 * | 8/2006 | Kawashima et al. | ......... 257/316 |
| 7,099,200 B2 * | 8/2006 | Sakui | ........................ 365/185.33 |
| 7,119,394 B2 * | 10/2006 | Hsieh et al. | .................... 257/316 |
| 7,183,157 B2 * | 2/2007 | Yoo et al. | ...................... 438/257 |
| 7,195,964 B2 * | 3/2007 | Ding | .............................. 438/201 |
| 7,250,337 B2 * | 7/2007 | Lee | ................................ 438/257 |
| 7,268,385 B2 * | 9/2007 | Nishizaka et al. | ............. 257/315 |
| 7,388,790 B2 * | 6/2008 | Maejima et al. | ......... 365/185.25 |
| 7,407,857 B2 * | 8/2008 | Jeno et al. | ..................... 438/257 |

(Continued)

*Primary Examiner* — Ida M Soward
(74) *Attorney, Agent, or Firm* — Dicke, Billig & Czaja, PLLC

(57) ABSTRACT

An integrated memory device, an integrated memory chip and a method for fabricating an integrated memory device is disclosed. One embodiment provides at least one integrated memory device with a drain, a source, a floating gate, a selection gate and a control gate, wherein the conductivity between the drain and the source can be controlled independently via the control gate.

25 Claims, 1 Drawing Sheet

U.S. PATENT DOCUMENTS

| | | | |
|---|---|---|---|
| 7,411,838 B2 * | 8/2008 | Kanamori | 365/185.28 |
| 7,414,283 B2 * | 8/2008 | Tanaka et al. | 257/314 |
| 7,436,019 B2 * | 10/2008 | Lutze et al. | 257/315 |
| 7,492,643 B2 * | 2/2009 | Takeuchi | 365/185.28 |
| 7,499,336 B2 * | 3/2009 | Liu et al. | 365/185.28 |
| 7,580,293 B2 * | 8/2009 | Kanamori et al. | 365/185.29 |
| 2003/0071301 A1 * | 4/2003 | Wald et al. | 257/314 |
| 2003/0127683 A1 * | 7/2003 | Yoo et al. | 257/315 |
| 2004/0175885 A1 * | 9/2004 | Schmitz et al. | 438/257 |
| 2005/0272205 A1 * | 12/2005 | Ding | 438/257 |
| 2006/0039199 A1 * | 2/2006 | Gratz et al. | 365/185.33 |
| 2006/0102948 A1 * | 5/2006 | Chang et al. | 257/315 |
| 2006/0121674 A1 * | 6/2006 | Jeno et al. | 438/257 |
| 2006/0131639 A1 * | 6/2006 | Jenq et al. | 257/316 |
| 2006/0163645 A1 * | 7/2006 | Guterman et al. | 257/316 |
| 2006/0220100 A1 * | 10/2006 | Tanaka et al. | 257/315 |
| 2007/0052006 A1 * | 3/2007 | Hikita | 257/315 |
| 2007/0158734 A1 * | 7/2007 | Chindalore | 257/315 |
| 2007/0183212 A1 * | 8/2007 | Kanamori | 365/185.23 |
| 2007/0200165 A1 * | 8/2007 | Jeong et al. | 257/315 |
| 2008/0009117 A1 * | 1/2008 | Bhattacharyya et al. | 438/264 |
| 2008/0042185 A1 * | 2/2008 | Lojek | 257/315 |
| 2008/0105916 A1 * | 5/2008 | Watanabe | 257/315 |
| 2008/0112231 A1 * | 5/2008 | Shum | 365/185.27 |

* cited by examiner

MEMORY DEVICE INCLUDING A GATE CONTROL LAYER

BACKGROUND

The present invention relates generally to an integrated memory device, an integrated memory chip and a method for fabricating an integrated memory device, and, in one embodiment, to a novel structure for a UCP (Uniform Channel Program) flash memory device.

Currently integrated memory device design, memory chip design and integrated memory circuit design are shaped by the continuous trend toward a higher storage density and toward higher write and read speeds while maintaining energy consumption of the memory devices and memory chips at a reasonable level.

Innovations in this field have been made to a greater extent in the area of the respective semiconductor technology used to fabricate such memory chips, but have related less to the basic structure of the known standard memory device.

In the following for the sake of brevity integrated memory device and integrated memory chip are shortly referred to as memory devices and memory chips.

UCP flash memory devices typically use Fowler-Nordheim tunneling for both read and write operations on a floating gate. In case of the customary basic structure of an UCP flash memory device, the stored digital information is retained by charged storage on the floating gate of the UCP flash memory device.

Typically the floating gate of such a memory device is assigned to a wordline WL via a (conventional, connected) selection gate of the memory device.

Setting the level of a wordline WL, i.e. of the selection gates of the corresponding integrated memory devices to low, causes these memory devices to be deselected for write and read operations.

If, in the case when a memory device is selected, this selected memory device, the floating gate of which is occupied by a stored charge representing a high level, is read out, a static read current flows through the channel formed between its drain terminal and its source terminal.

Upon read-out of a selected memory device the floating gate of which is occupied by a stored charge representing a low level, however, the channel is not sufficiently formed between its drain terminal and its source terminal and hence no or only a small static read current flows between the terminals.

In the known devices, the read-out of a selected memory device within a set of memory devices arranged in a plurality of memory device columns corresponding to bitlines is affected by connecting the source terminals and the drain terminals of the memory devices in each memory device column respectively in parallel to two separate respective bitlines per memory device column.

By using contact-connections the two bitlines can be set to predetermined potentials. In contrast to other memory device concepts in which the bitlines connected to the source terminals of the memory devices (i.e. the source lines) of different memory device columns can be set to a common potential, this is not possible in the case of the standard UCP flash memory device concept.

Hence a resulting static read current flows on the two respective bitlines connected to the memory device selected within a memory device column by the wordline. The magnitude of the occurring static read current represents the logic level of the memory occupancy of the selected memory device within a memory device column.

Moreover it is apparent from the above that two bitlines (for drain and source terminals) are necessary for memory devices according to the prior art for the read-out of the memory occupancy of prior art UCP flash memory devices.

Thus known memory devices are limited in the direction of the wordline in terms of its minimum dimensions to twice the conductor spacing requirements of the used semiconductor process (e.g., Infineon's C9FLR2-UCP, C120FL and C11FL/A technologies). In case of e.g., 1T UCP flash memory device the memory device pitch is limited to twice the minimum pitch of metal 2 and metal 3. As a result the limiting of the bitline pitch by the conductor pitch currently leads to relatively large sized memory device areas of 1T UCP memory devices.

Routing the bitlines in different wiring planes does not help to overcome the spacing limitations since, in principle, the spacing requirements between the interconnects and the contact holes (vias) for connecting different wiring planes in general are of the same magnitude as the spacing requirements between two interconnects.

Correspondingly the method to place the metal layers used for the bitlines one above the other is unsuitable for reducing the size of the device. One of the reasons for this is that the design rules for the stacked vias demonstrated that they necessitate substantially narrower tolerances than the design rules for metal layers lying one next to the other.

Due to the associated lower yield that is to be expected in this case, it is rather unlikely that the space saving would be successful.

Parallel to the bitlines, the memory device pitch dimension is typically already configured in minimal fashion corresponding to the state of the art. Thus the current concepts for UCP memories use particularly aggressive interconnection design rules in order to enable memory cell sizes that are as small as possible. In addition, the critical situation in the design of the memory cell is increased if the required contact-connections are realized in order to apply the necessary potentials to the two bitlines.

Correspondingly a competitive disadvantage remains for standard UCP memory devices in comparison with other device concepts, particularly in the case of large and very large memories.

For these or other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
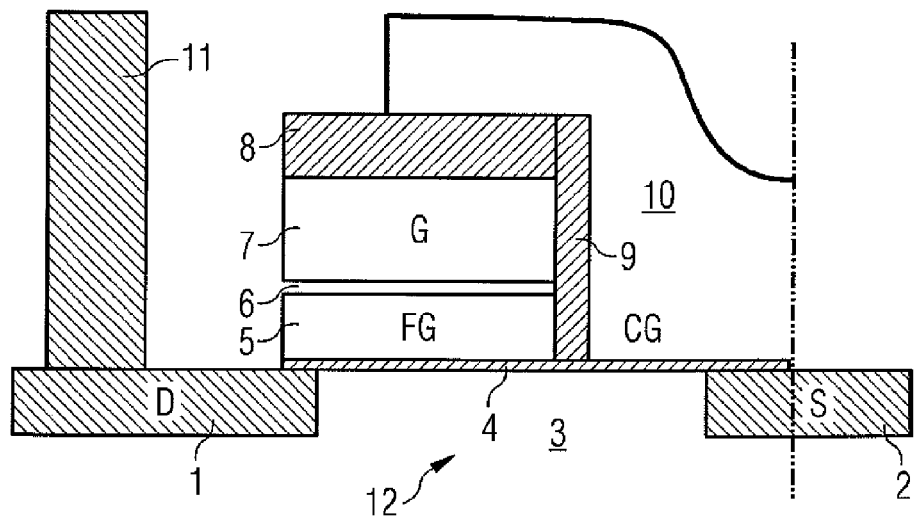
FIG. 1 illustrates a schematic, exemplary cross-section of the layer stack of an integrated memory device according to an embodiment of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

An integrated memory device is provided, at least including a drain terminal, a source terminal, a floating gate, a selection gate terminal and a control gate terminal, wherein the conductivity between the drain terminal and the source terminal can be controlled independently via the control gate terminal.

According to one or more embodiments, an integrated UCP flash memory device is provided including a drain terminal region, a source terminal region, a floating gate layer corresponding to a first gate, namely a floating gate, a selection gate layer corresponding to a second gate, namely a selection gate, a control gate layer corresponding to a third gate, namely a control gate, defined in a self-aligning manner at least between the floating gate layer and the source terminal region.

Another embodiment provides an integrated memory device including a drain terminal region and a source terminal region, a channel region arranged between the drain terminal region and the source terminal region, a tunneloxide layer arranged on the channel region, a floating gate layer arranged on a first part of the tunneloxide layer, a first insulating layer arranged on the floating gate layer, a selection gate layer arranged on the first insulating layer, a second insulating layer arranged on the selection gate layer, a control gate layer corresponding to a control gate and arranged at least on a second part of the tunneloxide layer; and a sidewall isolation arranged to isolate the control gate layer from the floating gate layer and the selection gate layer.

According to another embodiment, an integrated memory chip is provided including at least one integrated memory device according to the embodiments as mentioned above.

Another embodiment provides a method for fabricating an integrated memory device, the method including forming at least a drain terminal region, a source terminal region, a floating gate layer, a selection gate layer and a control gate layer, wherein the control gate layer is formed at least partly on a tunneloxide layer which is arranged between the drain terminal region and the source terminal region.

According to another embodiment, a method for fabricating an integrated memory device is provided, the method including forming a drain terminal region and a source terminal region, forming a tunneloxide layer between the drain terminal region and the source terminal region, forming a floating gate layer on a first part of the tunneloxide layer, forming a first insulating layer on the floating gate layer, forming a selection gate layer on the first insulating layer, forming a second insulating layer on the selection gate layer, forming a sidewall isolation adjacent to at least the edges of the floating gate layer, the first insulating layer, the selection gate layer and the second insulating layer facing towards the source terminal region, forming a control gate layer at least on a second part of the tunneloxide layer.

FIG. 1 illustrates a schematic, exemplary cross-section of the layer stack of an integrated memory device 12 according to an embodiment of the present invention.

In accordance with the present embodiment, the integrated memory device 12 is arranged on a separate semiconductor chip.

In one or more embodiments (not illustrated) the memory device may also be arranged on a single chip together with other integrated circuitry as for instance microcontroller, microprocessor or any custom circuitry.

The integrated memory device 12 according to the embodiment of FIG. 1 includes a drain terminal region 1 and a source terminal region 2 formed in a semiconductor body. The semiconductor region arranged between the drain terminal region 1 and the source terminal region 2 may serve as a channel region 3 for conducting charge carriers between the drain terminal region 1 and the source terminal region 2.

Further in the integrated memory device 12 according to the embodiment of FIG. 1 a tunneloxide layer 4 is arranged on the channel region 3 and slightly overlaps the right end of the drain terminal region 1 as well as the left end of the source terminal region 2.

In FIG. 1 the dashed vertical line through the source terminal region 2 represents a symmetry axis to the right side of which a memory device may fall into line with the memory device 12. This further memory device (however not illustrated in FIG. 1) may include a mirror-symmetrical structure to the memory device 12, i.e. with its source terminal region arranged adjacent to the source terminal region 2 of the memory device 12. Moreover the further memory device may share its source terminal region with the source terminal region 2 of the integrated memory device 12 as a common source terminal region corresponding to a common source. In this case the tunneloxide layer 4 may overlap the whole of the common source terminal region 2 of both memory devices.

Referring further to the embodiment of the integrated memory device 12 in FIG. 1 a floating gate layer 5 including a conducting material is arranged on a first, bigger part of the tunneloxide layer 4 adjacent to the drain terminal region 1. In one embodiment, the floating gate layer 5 may include poly-silicon as the conducting material. Alternatively the floating gate layer 5 may include metals like aluminum, copper or other metals which can be deposited on integrated semiconductor structures. With respect to the embodiment in FIG. 1 the floating gate layer 5 is arranged on the tunneloxide layer 4 to cover a first, bigger part of the channel region 3 adjacent to the drain terminal region 1.

In the integrated memory device 12 according to the embodiment of FIG. 1 a first insulating layer 6 is arranged on the floating gate layer 5 in order that the floating gate layer 5 is isolated between the tunneloxide layer 4 and the first insulating layer 6. The first insulating layer 6 may include silicon oxide, silicon nitride or any other insulating material typically used in integrated semiconductor device fabrication processes.

Still with regard to the embodiment of the integrated memory device 12 in FIG. 1 a conducting selection gate layer 7 is arranged on the first insulating layer 6. Similar to the floating gate layer 5 the selection gate layer 7 may include poly-silicon. Alternatively the selection gate layer 7 may include metals like aluminum, copper or other metals which can be deposited on integrated semiconductor structures.

Above the selection gate layer 7 in the embodiment of the integrated memory device 12 in FIG. 1 a second insulating layer 8 is arranged. The second insulating layer 8 may include silicon oxide, silicon nitride or any other insulating material typically used in integrated semiconductor device fabrication processes to isolate conducting layers. The second insulating layer 8 may be patterned using hardmask (HM) patterning.

In the embodiment of the integrated memory device 12 in FIG. 1 a sidewall isolation 9 is arranged adjacent to the side of the layer stack facing towards the source terminal region 2 the layer stack including the floating gate layer 5, the first insulation layer 6, the selection gate layer 7 and the second insulation layer 8.

Referring further to the embodiment of the integrated memory device 12 in FIG. 1 a (third) control gate layer 10 including a conducting material is arranged on the tunneloxide layer 4 over a second, smaller part of the channel region 3 adjacent to the source terminal region 2. However, in alternative embodiments of integrated memory devices, the ratio of the first and second parts of the channel region 3 indirectly covered by the floating gate layer 5 and the control gate layer 10 respectively may be chosen differently.

In the embodiment of the integrated memory device 12 in FIG. 1 the edge of the control gate layer 10 facing towards the drain terminal region 1 overlaps with the top edge of the layer stack facing towards the source terminal region 2, the layer stack including the sidewall isolation 9, the second insulation layer 8, the selection gate layer 7, the first insulation layer 6 and the floating gate layer 5. The overlap is such that the control gate layer 10 covers approximately two thirds of the top of the second insulation layer 8. However, in embodiments of integrated memory devices, the ratio of the top of the second insulation layer 8 covered by the control gate layer 10 may be chosen differently.

In still further embodiments the edge of the control gate layer 10 facing towards the drain terminal region 1 may be substantially aligned with the side of sidewall isolation 9 facing towards the source terminal region 2.

In the embodiment of the integrated memory device 12 in FIG. 1, similar to the floating gate layer 5 and the selection gate layer 7, the control gate layer 10 may include polysilicon. Alternatively the control gate layer 10 may include metals like aluminum, copper or other metals which can be deposited on integrated semiconductor structures.

Referring further to the embodiment of the integrated memory device 12 in FIG. 1 the tunneloxide layer 4 is a relatively thin layer compared to the thickness of the drain 1 and source terminal 2 region which allows Fowler-Nordheim tunneling of electrons from the channel region 3 onto the floating gate layer 5.

In the embodiment of the integrated memory device 12 in FIG. 1, the first insulating layer 6 is a relatively thin layer compared to the thickness of the drain 1 and source terminal 2 region in order that a relatively strong electrical programming field between the selection gate layer 7 and the floating gate layer 5, which is required for Fowler-Nordheim tunneling of electrons from the channel region 3 onto the floating gate layer 5, is not weakened to much.

Still with regard to the embodiment of the integrated memory device 12 in FIG. 1, the second insulating layer 8 is a relatively thick layer compared to the thickness of the tunneloxide layer 4 in order that a coupling between the selection gate layer 7 and the control gate layer 10, in particular a high dynamic capacitive coupling between these layers and the corresponding terminals of the memory device 12 may be avoided.

In principle the embodiment of the integrated memory device 12 in FIG. 1 is based on a UCP flash memory device including a floating gate as a first gate and a selection gate as a second gate, the memory device being additionally equipped with a control gate a third gate corresponding to the control gate layer 10. This control gate is defined in form of a split-gate in a self-aligned manner next to the source terminal region 2.

In the embodiment of the integrated memory device 12 in FIG. 1 the active part of the control gate is defined between the lower edge of sidewall isolation 9 facing towards the source terminal region 2 and the upper edge of the source terminal region 2 facing towards the drain terminal region 1.

The above mentioned further mirror-symmetrical memory device (to the right of the dashed line in FIG. 1, however not illustrated) may share the control gate layer 10 with the memory device 12 in FIG. 1.

Thus in the embodiment illustrated in FIG. 1 the structuring of the control gate layer 10 merely requires an edge positioning of the control gate layer 10 on the second insulating layer 8, which insolates the control gate layer 10 from the selection gate layer 7. I.e. a misalignment of the control gate layer 10 with respect to the second insulating layer 8 does not affect the electrical characteristics of the memory device 12. Within the application of a memory cell, the selection gate layer 7 corresponds to the wordline WL of the memory device 12.

In embodiments of adjacent memory devices sharing the control gate layer as described above, the source terminal region 2 may be shared too among these memory devices. This common source terminal region 2 may be formed by diffusion of a dopant and may act as a common source. In case of a plurality of adjacent columns of memory devices, the common source may be connected together between adjacent devices of different columns of memory devices and may be periodically connected to a conducting layer which may be set to a predetermined potential.

Similar to known UCP flash memory devices, the floating gate layer 5 corresponding to the floating gate FG of the memory device 12 is located between the selection gate layer 7 corresponding to the selection gate G and a first part of the channel region 3 corresponding to a first part of the split gate. Since the floating gate layer 5 is electrically isolated all around by the tunneloxide layer 4, the first insulating layer 6 and the sidewall isolation 9, any electrons placed on the floating gate layer 5 are trapped between the insulating layers and, under typical conditions, will not discharge for a period of many years.

When the floating gate FG holds a charge, it screens, i.e. partially cancels the electric field from the gate G, which modifies the threshold voltage VT of the memory device 12. For a read-out, the memory device 12 is selected via the wordline WL which is connected to its selection gate G by applying a voltage to the selection gate G. As a result the channel region 3 will become conducting or remain insulating, depending on the threshold voltage VT of the memory device 12, which is in turn controlled by the charge on the floating gate FG. The presence or absence or the amount of current flow through the channel region 3 can be sensed by a bitline BL connected via the drain contact 11 to the drain D of the memory device 12 and may form a binary or higher order code, representing the stored data.

As mentioned above the embodiment of the integrated memory device 12 in FIG. 1 resembles a UCP flash memory device, except that it includes three gates instead of two. The third active control gate CG is formed as the second part of the split gate by the part of the control gate layer 10 arranged on the tunneloxide layer 4 and covering the part of the channel region 3 between the sidewall isolation 9 and the edge of the source terminal region 2 facing towards the drain terminal region 1. Because of the split gate structure of the memory device 12, the conductivity between the drain terminal region 1 and the source terminal region 2 can be controlled independently via the control gate terminal of the memory device 12 corresponding to the control gate CG.

For programming the memory device 12, a set of memory devices connected to the same wordline WL as e.g., the memory device 12 may be selected by setting the wordline WL connected to the selection gates G of the selected memory devices to a high positive voltage (e.g., 14 V). Other memory devices may be deselected for programming by setting the voltage of the corresponding wordlines WL to 0 V. In the case of programming of the memory device 12, the function of the control gate CG of the memory device 12 is to isolate e.g., the selected bitline BL of the memory device 12 from the unselected bitline BL of another memory device of the set of memory devices selected by the wordline WL.

For this purpose the control gate CG is set to an appropriate negative voltage, e.g., in the case of programming to −3 V, to inhibit or at least affect the creation of a conducting channel between the drain D und the source S of the memory device 12.

As a result, the common source 2 of the memory device 12 and a mirror-symmetrical memory device to the right of the dashed line in FIG. 1 (not illustrated) can be left floating while the memory device 12 is being programmed. Therefore a second bitline to connect the source of each memory device separately is not required. Here the control gate CG effectively isolates the bitline BL of the mirror-symmetrical memory device, which e.g., may be unselected, from the bitline BL of the memory device 12, which e.g., may be selected.

This means that by using a memory device concept with an introduced third gate, namely the control gate CG, a second bitline (connected to the source S) is no longer required. Accordingly the limitation of the spacing between two adjacent columns of memory devices within a memory chip by the pitch between the formerly required two bitlines per memory device, i.e. by the metal pitch is obviated. Therefore the memory device and the corresponding memory cell can be shrinked down in direction of the wordline (i.e. in x direction of a matrix of memory devices) towards smaller device pitches/coupling factors. The resulting smaller coupling factor may be compensated for by an increased symmetrisation of the UCP biasing.

During programming of a memory device according to the embodiment in FIG. 1, the bitline BL of a memory device which is connected to its drain D may be selected by setting the drain D to an appropriate negative voltage (e.g., −3 V). The resulting high electrical field between the floating gate FG and the part of the channel region 3 underneath the floating gate FG causes electrons to tunnel from this part of the channel region 3 through the tunneloxide layer 4 to create a negative charge on the floating gate FG. This negative charge on the floating gate FG inhibits or at least affects the creation of a conducting channel between drain D and source S of the memory device 12 such that the resulting channel current during read-out of the memory device 12 can be used to encode the stored information. For example in the case when the negative charge on the floating gate total inhibits a conducting channel, the corresponding channel current substantially equaling zero may be used to encode the stored information to be a logical "0". However in other embodiments a channel current substantially equaling zero may be used to encode a logical "1".

During programming of a memory device according to the embodiment in FIG. 1, the bitline BL of a memory device may be deselected by setting the drain D to an appropriate positive voltage (e.g. 3 V). In this case the resulting electrical field between the floating gate FG and the part of the channel region 3 underneath the floating gate FG is not high enough to cause electrons to tunnel from this part of the channel region 3 through the tunneloxide layer 4 to create a negative charge on the floating gate FG. As a result, no negative charge is created on the floating gate FG which could affect the creation of a conducting channel between drain D and source S of the memory device 12. Thus the resulting unaffected channel current during read-out of the memory device 12 can be used to encode the stored information, e.g., a logical "1". However in other embodiments an unaffected channel current may be used to encode a logical "0".

For erasing the memory device 12, a set of memory devices connected to the same wordline WL as e.g., the memory device 12 may be selected by setting the wordline WL connected to the gates G of the selected memory devices to a high negative voltage (e.g., −14 V). Other memory devices may be deselected for erasure by setting the voltage of the corresponding wordlines WL to 0 V. Also in the case of erasing the memory device 12, the function of the control gate CG of the memory device 12 is to isolate e.g., the selected bitline BL of the memory device 12 from the unselected bitline BL of another memory device of the set of memory devices selected by the wordline VL.

For this purpose the control gate CG is set to an appropriate positive voltage, e.g., in the case of erasing to 3 V, to inhibit or at least affect the creation of a conducting channel between the drain D und the source S of the memory device 12. As a result, the common source 2 of the memory device 12 and a mirror-symmetrical memory device to the right of the dashed line in FIG. 1 (not illustrated) can be left floating while the memory device 12 is being erased. Again the control gate CG effectively isolates the bitline BL of the mirror-symmetrical memory device, which e.g., may be unselected, from the bitline BL of the memory device 12, which e.g., may be selected.

During erasure of a memory device according to the embodiment in FIG. 1, the bitline BL of a memory device which is connected to its drain D may be selected by setting the drain D to an appropriate positive voltage (e.g., 3 V). The resulting high electrical field between the floating gate FG and the part of the channel region 3 underneath the floating gate FG causes electrons to tunnel from the floating gate FG to the part of the channel region 3 underneath the floating gate FG through the tunneloxide layer 4 to discharge a negative charge previously stored on the floating gate FG, meaning that the charge and therefore the information state of the memory device 12 is being erased.

As a result, no negative charge rests on the floating gate FG to affect the creation of a conducting channel between drain D and source S of the memory device 12. Thus, after erasure, the channel current during read-out of the memory device 12 is unaffected again which can be used to encode the complementary information to the information stored prior to erasure.

During erasure of a memory device according to the embodiment in FIG. 1, the bitline BL of a memory device may be deselected by setting the drain D to an appropriate negative voltage (e.g. −3 V). In this case the resulting electrical field between the part of the channel region 3 underneath the floating gate FG and the floating gate FG and is not high enough to cause electrons to tunnel from the floating gate FG to the part of the channel region 3 underneath the floating gate FG through the tunneloxide layer 4 to discharge a negative charge previously stored on the floating gate FG.

As a result, the charge state of the floating gate FG of memory devices with their bitlines BL unselected remains unchanged during erasure.

For the read-out of the memory device 12, a set of memory devices connected to the same wordline WL as e.g., the memory device 12 may be selected by setting the wordline WL connected to the gates G of the selected memory devices to a positive voltage (e.g., 3.3 V). Other memory devices may be deselected for read-out by setting the voltage of the corresponding wordlines WL to 0 V.

In the case of the read-out of the memory device 12, the function of the control gate CG of the memory device 12 is to connect the selected bitline BL connected to the drain D of the memory device 12 with the source S of the memory device 12 to unaffectedly sense the charge state of the floating gate FG and therefore information state of the memory device 12. For unaffected sensing of the charge state of the floating gate FG the control gate CG may be set to substantially the same read voltage as the selection gate G connected to the selected wordline WL of the memory device 12 (e.g., 3.3 V).

Correspondingly, for the read-out of a memory device, the bitline BL connected to the drain D of the memory device selected for read-out, e.g., of the memory device 12, is set to a positive voltage (e.g., 1.2 V) while the source S of the same selected memory device 12 is set to a lower voltage (e.g., 0 V) to respectively cause or not to cause a channel current through the channel region 3 depending on the charge state of the floating gate FG and the threshold voltage VT of the memory device 12. Other memory devices may be deselected for read-out by setting the voltage of the corresponding bitlines BL to 0 V.

The above described operation modes and examples of corresponding terminal voltages of the memory device 12 according to the embodiment in FIG. 1 are summarized in the subsequent table. Furthermore, the table gives examples for appropriate voltages of the well of the memory device 12, i.e. the part of the semiconductor body in which the memory device 12 is formed, during the indicated device operations.

TABLE

| | WL | WL unselect | CG | Source | Drain select | Drain unselect | Well |
|---|---|---|---|---|---|---|---|
| Program | 14 V | 0 V | −3 V | float | −3 V | 3 V | −3 V |
| Erase | −14 V | 0 V | 3 V | float | 3 V | −3 V | 3 V |
| Read | 3.3 V | 0 V | 3.3 V | 0 V | 1.2 V | 0 V | 0 V |

Another effect of the memory device concept with a third gate, as for example the embodiment of the memory device 12 in FIG. 1, is that the rate of "overerased" memory devices among all memory devices on a memory chip is lower if the new memory device concept is used, compared e.g., to the 1 T UCP memory device concept, since only one memory device per bitline is sensitive to "overerase".

"Overerase" of a memory device refers to the phenomenon that e.g., because of repeated erasure of a memory device which has already been erased or due to an erase voltage pulse on a wordline WL which lasts too long, too much negative charge tunnels from the floating gate such that the corresponding floating gate may eventually even carry a positive charge. As a result, an "overerased" memory device may eventually acquire a threshold voltage below 0 V. Generally a memory device with a threshold voltage erased below 0 V is referred to as being "overerased".

An "overerase" situation as described above is undesirable since the programming characteristics of an overerased memory device become deteriorated more rapidly. In particular, the number of times the memory device can be reprogrammed, which is referred to as the "endurance" of the memory device, is reduced. Furthermore overerased memory devices are highly undesirable because they create bitline leakage current during programming or read-out operations.

For instance, during programming or read-out, typically only one wordline carries a positive voltage, while the remaining wordlines are typically grounded. A device with a threshold voltage below 0 V and with its wordline grounded, or at 0 V, will conduct a bitline leakage current. Due to this bitline leakage current, power supplies providing power to a bitline during programming may become overloaded. Similarly, bitline leakage current during read-out may cause read errors.

In order to prevent "overerase" situations, manufacturers of integrated circuits containing flash memory devices typically have to provide overerase correction mechanisms often referred to as overerase algorithms (OEA) as, for instance, differential read-out procedures.

However, in memory devices using the new memory device concept with its split gate architecture, the threshold voltage of this memory device cannot drop below 0 V as in conventional memory devices since split gate part formed by the control gate sets a lower limit to the threshold voltage. As a result, no bitline leakage current which may give rise to overloading or read errors can occur when using the new memory device concept.

Thus, also due to the reduced overerase rate the new memory device concept may allow savings with regard to overerase algorithms (OEA) and hence allow further savings of chip area and of power consumption.

In embodiments wherein a memory device adjacent to a selected memory device share the control gate (e.g., as indicated in FIG. 1 by the dashed line, while the memory device adjacent to memory device 12 is actually not illustrated), only this memory device adjacent to a selected memory device may remain overerase sensitive.

Figure 2:
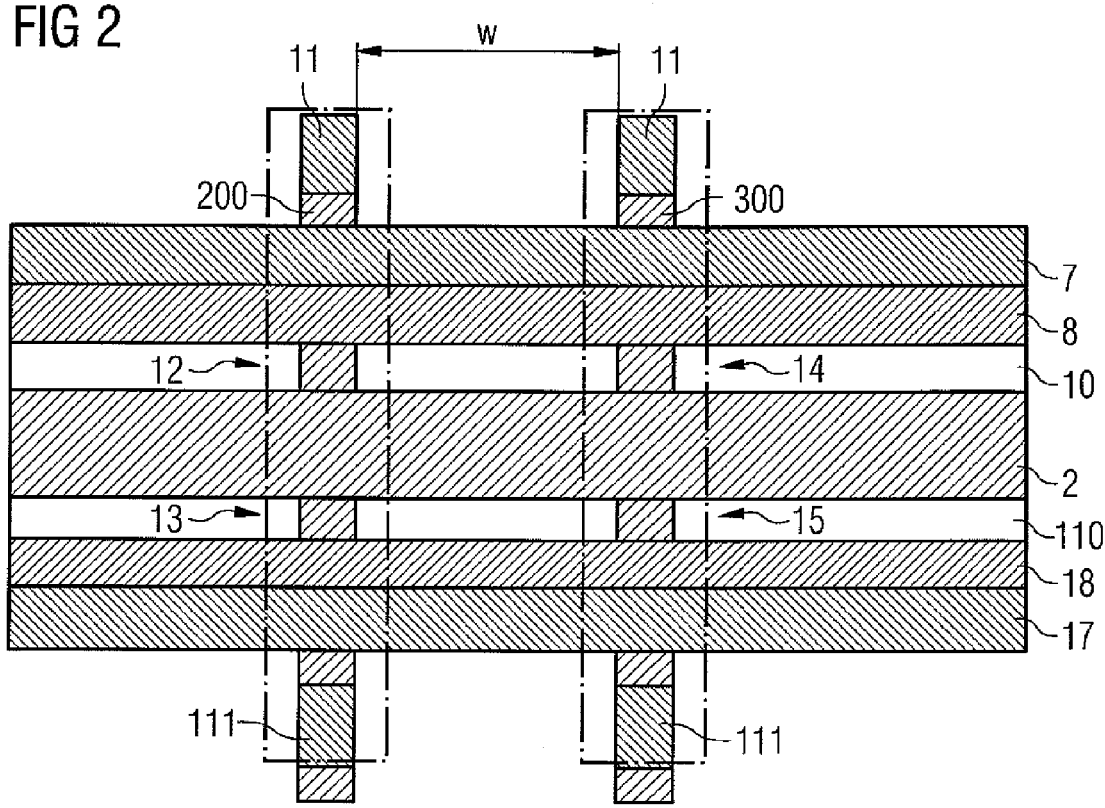
FIG. 2 illustrates a schematic layout top view of integrated memory devices according to an embodiment arranged in two memory device columns of two memory devices each sharing a common source.

With respect to FIG. 2 a schematic layout top view of integrated memory devices according to an embodiment is illustrated wherein the integrated memory devices 12, 13, 14 and 15 are arranged in two memory device columns 200, 300 of two memory devices each sharing a common source 2. The two memory device columns 200, 300 correspond to two bitlines.

Thus the embodiment in FIG. 2 illustrates that unlike conventional UCP memory devices, memory devices using the new device concept with a third gate (implemented by the control gate layers 10 and 110 in poly-silicon) and belonging to different bitline columns, as e.g., memory devices 12 and 14 may have their source terminal regions 2 connected together. Since in the arrangement in FIG. 2 the memory devices 12 and 13 of the left memory device column already share their source terminal regions 2 as a common source, all four memory devices in FIG. 2 share this common source.

Therefore in the embodiment of an arrangement of integrated memory devices according to FIG. 2 separate second bitlines connected to the sources of memory devices 12 and 13 or 14 and 15 may be obviated. Hence the pitch w between two adjacent memory device columns, e.g., the memory device columns 200 and 300, is no longer limited by the spacing limitation between conductor layers for two separate bitlines per memory device column.

In one embodiment of an arrangement of integrated memory devices according to FIG. 2, the memory devices 12 and 14 of the upper row of the arrangement are assigned to a first wordline corresponding to the upper selection gate layer 7 in poly-silicon.

Correspondingly, the memory devices 13 and 15 of the lower row of the arrangement are assigned to a second wordline corresponding to the lower selection gate layer 17 in poly-silicon.

The drain terminal regions of the memory devices 12 and 14 of the upper row of the arrangement can be connected to the corresponding bitlines via the drain contacts 11, while the drain terminal regions of the memory devices 13 and 15 of the lower row of the arrangement can be connected to the corresponding bitlines via the drain contacts 111.

In one embodiment of an arrangement of integrated memory devices according to FIG. 2 the poly-silicon control gate layers 10 and 110 for the upper and lower row of the arrangement are recessed toward the poly-silicon selection gate layers 7 and 17 (wordlines) respectively such that, in the layout-topview of FIG. 2, the second insulation layers 8 and 18 between the poly-silicon selection gate layers 7 and 17 the poly-silicon control gate layers 10 and 110 for upper and lower row respectively are visible.

Other embodiments relate a method for fabricating an integrated memory device which includes the processes of forming at least a drain terminal region, a source terminal region, a floating gate layer, a selection gate layer, and a control gate layer, wherein the control gate layer is formed at least partly on a tunneloxide layer between the drain terminal region and the source terminal region.

In certain embodiments of the method for fabricating an integrated memory device, the control gate layer defines a control gate in a self-aligning manner between the floating gate layer and the source terminal region.

In certain embodiments of the method for fabricating an integrated memory device, forming the source terminal region includes diffusion of a dopant.

In certain of the above mentioned embodiments of the method for fabricating an integrated memory device, forming the control gate layer includes burring the source terminal region underneath the control gate layer.

In alternative embodiments of the method for fabricating an integrated memory device, after forming the control gate layer by deposition, forming the source terminal region includes ion implantation which is self-aligning by the topology of the control gate layer such that the source terminal region is buried underneath the control gate layer.

In one embodiment, for this purpose the energy for ion implantation of the source terminal region should be chosen high enough in order that the implanted ions reach the semiconductor body region (the substrate region) in the source terminal region. However, at the same time, the energy of the implanted ions should be low enough such that the ions are blocked in the layer stack at least including the selection gate layer and the floating gate layer.

In certain of the above mentioned alternative embodiments of the method for fabricating an integrated memory device, a poly CMP process is applied after forming the source terminal region.

In certain of the above mentioned alternative embodiments of the method for fabricating an integrated memory device after the poly CMP process a poly recess process is applied to improve the high voltage isolation between the control gate layer and the selection gate layer.

Certain memory devices and methods according to the embodiments as described above may be used in embedded flash technologies.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit memory device comprising:
   a first memory device comprising:
   a drain;
   a source;
   a floating gate;
   a selection gate above the floating gate; and
   a control gate layer comprising an end with an edge above an aligned layer stack comprising the floating gate and the selection gate such that the control gate layer overlaps approximately two thirds of the layer stack, the control gate layer configured such that the conductivity between the drain and the source can be controlled independently via the control gate layer; and
   a further memory device mirror-symmetrical to the first memory device sharing the control gate layer with the first memory device.

2. The device of claim 1, wherein the source is configured as a common source for the further memory device.

3. The device of claim 1, comprising:
   a bit line coupled to the drain.

4. The device of claim 1, comprising:
   a tunnel oxide layer extending between the drain and the source.

5. The device of claim 4, wherein the tunnel oxide layer is between the control gate layer and the source.

6. The device of claim 4, wherein the tunnel oxide layer at least partially overlaps the drain and the source.

7. The device of claim 4, wherein the floating gate is positioned on the tunnel oxide layer.

8. The device of claim 4, wherein the aligned layer stack comprises:
   the floating gate;
   a first insulation layer;
   the selection gate; and
   a second insulation layer.

9. The device of claim 8, wherein the aligned layer stack is located on the tunnel oxide layer, adjacent the drain.

10. The device of claim 8, comprising:
    a sidewall isolation positioned along an edge of the aligned layer stack, facing the source.

11. An integrated circuit UCP flash memory device comprising:
    a first memory device comprising:
    a drain terminal region;
    a source terminal region;
    a floating gate layer corresponding to a first gate, namely a floating gate;
    a selection gate layer above the floating gate layer, and corresponding to a second gate, namely a selection gate; and
    a control gate layer corresponding to a third gate, namely a control gate, the control gate layer comprising an end with an edge arranged above an aligned layer stack comprising the floating gate layer and the selection gate layer such that the control gate layer overlaps approximately two thirds of the layer stack, the control gate layer configured such that the conductivity between the drain terminal region and the source terminal region can be controlled independently via the control gate layer; and a further memory device mirror-symmetrical to the first memory device sharing the control gate layer with the first memory device.

12. The integrated circuit memory device of claim 11, wherein the source terminal region includes a diffusion region buried underneath the control gate layer.

13. The integrated circuit memory device of claim 11, wherein the source terminal region comprises an ion implantation region which is defined in a self-aligning manner through the topology of the control gate layer.

14. The integrated circuit memory device of claim 11, wherein the edge of the control gate layer facing towards the drain terminal region is substantially aligned with the edge of the selection gate layer facing towards the source terminal region.

15. The integrated circuit memory device of claim 11, wherein the edge of the control gate layer facing towards the drain terminal region overlaps with the edge of the selection gate layer facing towards the source terminal region.

16. The integrated circuit memory device of claim 11, wherein at least one of the layers comprising the floating gate layer and the selection gate layer comprises poly-silicon.

17. An integrated memory chip comprising at least one integrated circuit memory device according to claim 11.

18. The integrated memory chip of claim 17, wherein at least one pair of adjacent integrated circuit memory devices share their source terminal regions as a common source.

19. The integrated memory chip of claim 18, wherein at least two pairs of integrated circuit memory devices are arranged in columns such that their common sources are connected together and the connected common sources are periodically connected to a conducting layer which may be set to a predetermined potential.

20. An integrated circuit memory device comprising:
a first memory device comprising:
    a drain terminal region and a source terminal region;
    a channel region arranged between the drain terminal region and the source terminal region;
    a tunnel oxide layer arranged on the channel region;
    a floating gate layer arranged on a first part of the tunnel oxide layer;
    a first insulating layer arranged on the floating gate layer;
    a selection gate layer arranged on the first insulating layer and above the floating gate layer;
    a second insulating layer arranged on the selection gate layer;
    a control gate layer corresponding to a control gate and arranged at least on a second part of the tunnel oxide layer, the control gate layer comprising an end with an edge above an aligned layer stack comprising the floating gate layer and the selection gate layer such that the control gate layer overlaps approximately two thirds of the layer stack; and
    a sidewall isolation arranged to isolate the control gate layer from the floating gate layer and the selection gate layer; and
a further memory device mirror-symmetrical to the first memory device sharing the control gate layer with the first memory device.

21. The integrated circuit memory device of claim 20, wherein the control gate is defined in a self-aligning manner between the sidewall isolation and the source terminal region.

22. The integrated circuit memory device of claim 20, wherein the source terminal region comprises a diffusion region buried underneath the control gate layer.

23. The integrated circuit memory device of claim 20, wherein the source terminal region comprises an ion implantation region which is defined in a self-aligning manner through the topology of the control gate layer.

24. The integrated circuit memory device of claim 20, wherein the integrated circuit memory device is based on a UCP flash memory device.

25. An integrated circuit chip comprising:
a plurality of integrated memory devices each comprising a drain region, a source region, a floating gate, a selection gate, and a control gate comprising an end with an edge above an aligned layer stack comprising the floating gate and the selection gate such that the control gate overlaps approximately two thirds of the layer stack,
wherein at least one pair of adjacent integrated memory devices share their source regions as a common source, and
wherein at least two pairs of integrated memory devices are arranged in columns such that their common sources are connected together and the connected common sources are periodically connected to a conducting layer which may be set to a predetermined potential.

* * * * *